United States Patent
Naito

(10) Patent No.: US 10,043,791 B2
(45) Date of Patent: Aug. 7, 2018

(54) ELECTRIC FIELDS RELAXATION FOR SEMICONDUCTOR APPARATUS

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/243,982

(22) Filed: Aug. 23, 2016

(65) Prior Publication Data
US 2017/0110447 A1    Apr. 20, 2017

(30) Foreign Application Priority Data
Oct. 14, 2015    (JP) .................... 2015-203103

(51) Int. Cl.
| H01L 29/78 | (2006.01) |
| H01L 27/02 | (2006.01) |
| H01L 29/10 | (2006.01) |
| H01L 29/739 | (2006.01) |
| H01L 29/866 | (2006.01) |

(52) U.S. Cl.
CPC ...... H01L 27/0255 (2013.01); H01L 29/1095 (2013.01); H01L 29/7393 (2013.01); H01L 29/7823 (2013.01); H01L 29/866 (2013.01)

(58) Field of Classification Search
CPC .................... H01L 27/0255; H01L 29/7823
See application file for complete search history.

(56) References Cited

U.S. PATENT DOCUMENTS

| 5,973,359 A | 10/1999 | Kobayashi et al. |
| 6,407,413 B1 | 6/2002 | Kawamoto |
| 2005/0167694 A1* | 8/2005 | Takahashi ........... H01L 29/0696 257/127 |
| 2015/0044989 A1 | 2/2015 | De Foy et al. |
| 2015/0048450 A1 | 2/2015 | Naito |
| 2015/0340356 A1 | 11/2015 | Naito |

FOREIGN PATENT DOCUMENTS

| JP | 2001-94092 A | 4/2001 |
| WO | 2014/142331 A1 | 9/2014 |

\* cited by examiner

*Primary Examiner* — Daniel Whalen

(57) ABSTRACT

A semiconductor apparatus includes a semiconductor substrate, a semiconductor element, an edge termination region that surrounds the semiconductor element, a protective diode that has a first terminal and a second terminal, where the first terminal is positioned within the edge termination region and the second terminal is positioned outside the edge termination region, and a diffusion layer that has a floating potential, where the diffusion layer is provided in a gap portion between a region of the edge termination region that is aligned with the protective diode and the protective diode.

15 Claims, 9 Drawing Sheets

1000

ELECTRIC FIELDS RELAXATION FOR SEMICONDUCTOR APPARATUS

The contents of the following Japanese patent application are incorporated herein by reference: NO. 2015-203103 filed on Oct. 14, 2015.

BACKGROUND

1. Technical Field

The present invention relates to a semiconductor apparatus.

2. Related Art

In the conventional art, a semiconductor apparatus used to, for example, ignite an internal combustion engine has been formed by a one-chip igniter integrally including a power semiconductor device that is configured to deal with high power and an integrated circuit that is configured as an NMOS circuit (see, for example, Patent Documents 1 to 5).

Patent Document 1: Japanese Patent Application Publication No. 2001-217420

Patent Document 2: Japanese Patent Application Publication No. 11-145466

Patent Document 3: Japanese Patent Application Publication No. 2001-94092

Patent Document 4: International Publication No. 2014/073656

Patent Document 5: International Publication No. 2014/142331

Such an igniter has achieved a high breakdown voltage of approximately 400 V by, for example, providing a protective diode between the collector and the gate of the power semiconductor device. When a high voltage exceeding, for example, 400 V is input into the collector of such an igniter, however, electric fields concentrate in at least part of the surrounding region of the protective diode and the power semiconductor device may resultantly break down.

SUMMARY

Therefore, it is an object of an aspect of the innovations herein to provide a semiconductor apparatus, which is capable of overcoming the above drawbacks accompanying the related art. The above and other objects can be achieved by combinations described in the claims.

A first aspect of the innovations may include a semiconductor apparatus including a semiconductor substrate, a semiconductor element that is formed in the semiconductor substrate and provides a main current, an edge termination region that is formed in the semiconductor substrate on a first surface side thereof, where the edge termination region surrounds the semiconductor element, a protective diode that is formed on a first surface of the semiconductor substrate and has a first terminal and a second terminal, where the first terminal is positioned within a region enclosed by the edge termination region and the second terminal is positioned outside the region enclosed by the edge termination region, and a diffusion layer that has a floating potential and is formed in the semiconductor substrate on the first surface side thereof, where the diffusion layer is provided in a gap portion between a region of the edge termination region that is aligned with the protective diode and the protective diode and has a conductivity type that is opposite to a conductivity type of the first surface of the semiconductor substrate.

A second aspect of the innovations may include a semiconductor apparatus including a semiconductor substrate, a semiconductor element that is formed in the semiconductor substrate and provide a main current, an edge termination region that is formed in the semiconductor substrate on a first surface side thereof, where the edge termination region surrounds the semiconductor element, a protective diode that is formed on a first surface of the semiconductor substrate, where the protective diode has a terminal positioned within a region enclosed by the edge termination region and a terminal positioned outside the region enclosed by the edge termination region, and a diffusion layer that is formed in the semiconductor substrate on the first surface side thereof, where the diffusion layer is provided only in a portion of a periphery of the edge termination region, where the portion includes a gap portion between a region of the edge termination region that is aligned with the protective diode and the protective diode, and the diffusion layer has a conductivity type that is opposite to a conductivity type of the first surface of the semiconductor substrate.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
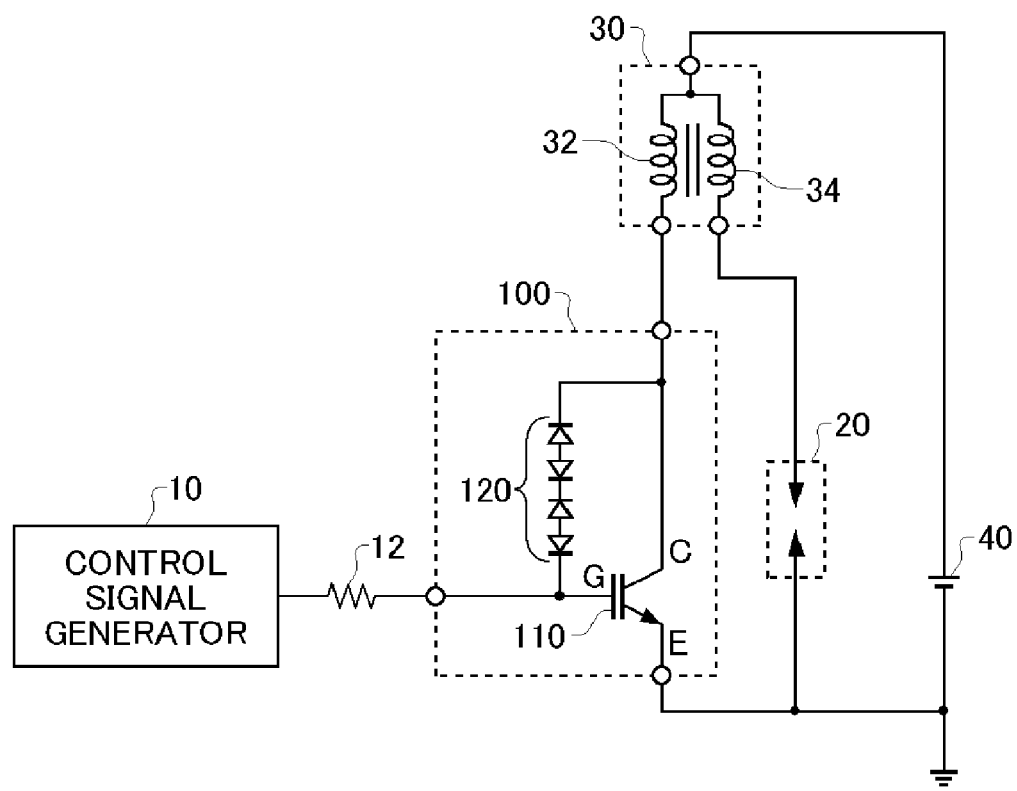
FIG. 1 shows an exemplary structure of an ignition device 1000 relating to an embodiment of the present invention.

FIG. 1 shows an exemplary structure of an ignition device 1000 relating to an embodiment of the present invention.

The ignition device 1000 is configured to ignite an ignition plug for use with an internal combustion engine of an automobile, and the like. In the present embodiment, an exemplary case is described where the ignition device 1000 is installed in an automobile engine. The ignition device 1000 includes a control signal generator 10, a resistance 12, an ignition plug 20, an ignition coil 30, a power source 40, and a semiconductor apparatus 100.

The control signal generator 10 is configured to generate a switching control signal to switch on and off the semiconductor apparatus 100. The control signal generator 10 is, for example, part of or an engine control unit (ECU) of the automobile having the ignition device 1000 installed therein. The control signal generator 10 feeds the generated switching control signal to the semiconductor apparatus 100 via the resistance 12. In response to the control signal generator 10 feeding the switching control signal to the semiconductor apparatus 100, the ignition device 1000 starts igniting the ignition plug 20.

The ignition plug 20 discharges to generate electric sparks. The ignition plug 20 discharges when applied with a voltage of approximately 10 kV or higher, for example. The ignition plug 20 is, for example, installed within an internal combustion engine. In this case, the ignition plug 20 ignites a combustible gas such as a gas mixture within a combustion chamber. The ignition plug 20 is, for example, disposed in a through hole connecting together the outside of the cylinder and the combustion chamber within the cylinder and secured in a manner to seal the through hole. In this case, one of the ends of the ignition plug 20 is exposed within the combustion chamber and the other receives an electrical signal from the outside of the cylinder.

The ignition coil 30 feeds the electrical signal to the ignition plug 20. The ignition coil 30 feeds, as the electrical signal, a high voltage sufficient to cause the ignition plug 20 to discharge. The ignition coil 30 may function as a transformer, and may be an ignition coil including a primary coil 32 and a secondary coil 34, for example. One of the ends of the primary coil 32 is electrically connected to one of the ends of the secondary coil 34. The primary coil 32 has a smaller number of windings than the secondary coil 34, and the primary coil 32 and the secondary coil 34 share the core. The secondary coil 34 generates electromotive force (electromotive force generated by mutual induction) according to the electromotive force generated in the primary coil 32. The other end of the secondary coil 34 is connected to the ignition plug 20, so that the generated electromotive force is fed to the ignition plug 20 to cause the ignition plug 20 to discharge.

The power source 40 feeds a voltage to the ignition coil 30. For example, the power source 40 feeds a predetermined constant voltage Vb (for example, 14 V) to one of the ends of the primary coil 32 and one of the ends of the secondary coil 34. The power source 40 is, for example, a battery of the automobile.

The semiconductor apparatus 100 allows or stops the current flow between the other end of the primary coil 32 of the ignition coil 30 and the reference potential, in response to the switching control signal fed from the control signal generator 10. For example, the semiconductor apparatus 100 allows the current flow between the primary coil 32 and the reference potential when the switching control signal has a HIGH voltage (on voltage) and stops the current flow between the primary coil 32 and the reference potential when the switching control signal has a LOW voltage (off voltage). Here, the reference potential may be the reference potential in the control system of the automobile, or the reference potential for the semiconductor apparatus 100 in the automobile. The reference potential may be equal to the LOW voltage that is designed to turn off the semiconductor apparatus 100, for example, 0 V. The semiconductor apparatus 100 includes a semiconductor element 110 that is configured to provide main currents and a protective diode 120.

The semiconductor element 110 has a gate terminal (G), an emitter terminal (E) and a collector terminal (C). The emitter and collector terminals are electrically connected to each other or disconnected from each other in response to the switching control signal to be input into the gate terminal. The semiconductor element 110 is, for example, a vertical semiconductor switch. The semiconductor element 110 is, for example, an insulated gate bipolar transistor (IGBT). Alternatively, the semiconductor element 110 may be MOSFET. For example, the semiconductor element 110 is connected to the reference potential at the emitter terminal thereof and to the other end of the primary coil 32 at the collector terminal thereof. In the present exemplary embodiment, the description is made in relation to an exemplary case where the semiconductor element 110 is an insulated gate bipolar transistor.

The protective diode 120 is provided between the collector terminal of the semiconductor element 110 and the gate terminal of the semiconductor element 110. The protective diode 120 is configured to prevent the high voltage input through the collector terminal from being input into the gate terminal. The protective diode 120 desirably exhibits a breakdown voltage of approximately several hundred voltages. The protective diode 120 includes a plurality of zener diodes, for example.

In the semiconductor apparatus 100 in accordance with the above-described present embodiment, the semiconductor element 110 is turned on when the switching control signal has the HIGH voltage. As a result, a collector current Ic originates from the power source 40 and flows into the semiconductor element 110 via the primary coil 32 of the ignition coil 30. Here, the temporal change rate dIc/dt of the collector current Ic is determined by the inductance of the primary coil 32 and the voltage fed from the power source 40, and the collector current Ic increases until it reaches a predetermined (or designated) current value. For example, the collector current Ic increases until it reaches approximately several amperes, dozen amperes or several dozen amperes.

Subsequently, once the switching control signal transitions to the LOW voltage, the semiconductor element 110 is turned off and the collector current dramatically decreases. The dramatic decrease in the collector current drastically increases the voltage across the primary coil 32 due to the electromotive force generated by self induction, which generates induction and resultantly electromotive force of up to approximately several dozen kilovolts across the secondary coil 34. In the ignition device 1000, the voltage across the secondary coil 34 is fed to the ignition plug 20 in order to cause the ignition plug 20 to discharge to ignite the combustible gas.

Here, if the voltage across the primary coil 32 increases to the level approximately equal to the breakdown voltage of the protective diode 120 (for example, 400 V), a current gradually starts to flow from the collector terminal to the gate terminal. Here, the current flowing from the collector terminal to the gate terminal and the resistance 12 determine the gate voltage of the semiconductor element 110. Thus, as the voltage across the primary coil 32 increases, the gate voltage of the semiconductor element 110 increases. Once the gate voltage reaches the level approximately equal to the threshold Vth of the semiconductor element 110 (for example, 2 V), the impedance at the collector of the semiconductor element 110 decreases. In this way, in the semiconductor element 110, the voltage between the collector terminal and the emitter terminal is regulated to be substantially equal to the total of the threshold Vth and the breakdown voltage of the protective diode 120 (the voltage between the collector terminal and the emitter terminal is clamped).

As described above, the ignition device 1000 relating to the present embodiment can ignite the ignition plug 20 in response to the switching control signal. The semiconductor apparatus 100 uses the protective diode 120 to clamp the voltage between the collector terminal and the emitter terminal in the semiconductor element 110, so that the semiconductor element 110 is prevented from breaking down. The semiconductor apparatus 100 is described in the following.

Figure 2:
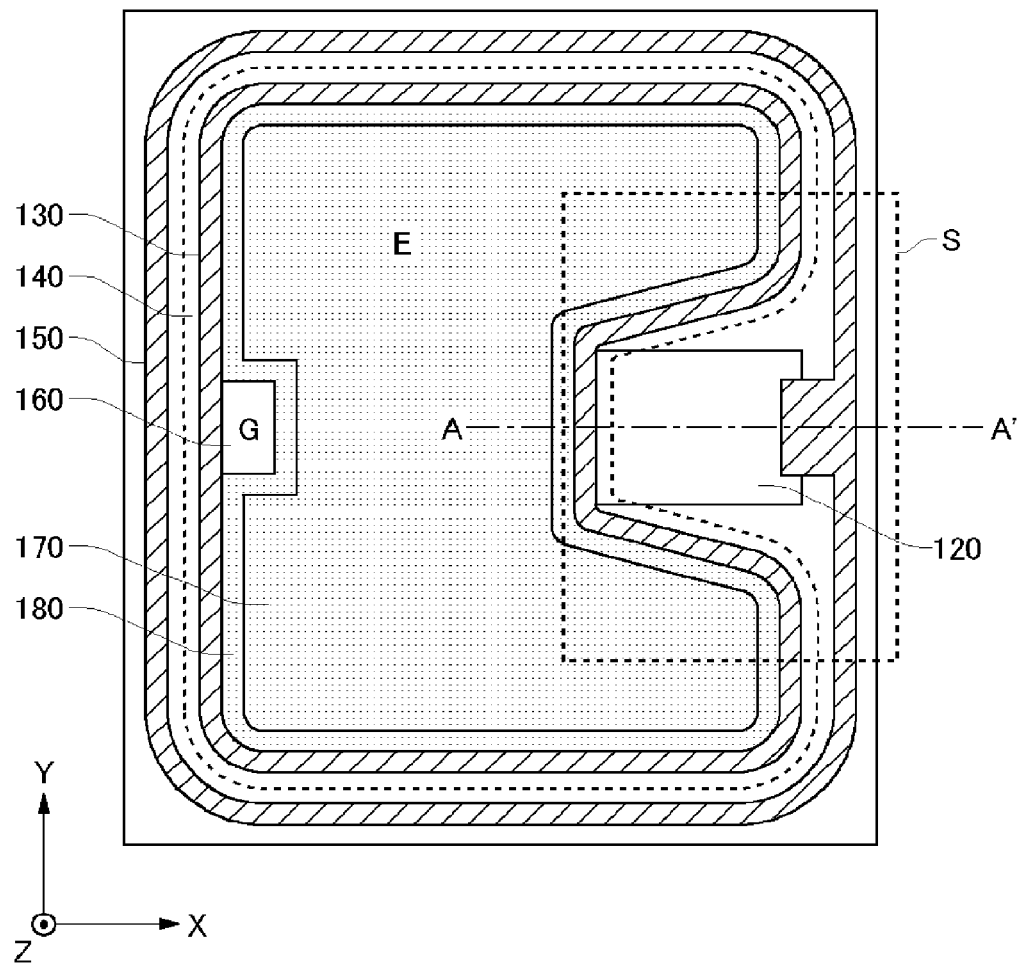
FIG. 2 shows an exemplary structure of a first surface of a semiconductor apparatus 100 relating to an embodiment of the present invention, on which a gate electrode and an emitter electrode are formed.

FIG. 2 shows an exemplary structure of a first surface of the semiconductor apparatus 100 relating to the embodiment of the present invention, on which the gate electrode and the emitter electrode are formed. FIG. 2 shows an example where a first surface of the semiconductor apparatus 100 denotes the surface facing the +Z direction and the first surface is defined as being substantially parallel to the XY plane. FIG. 2 shows the protective diode 120, a runner electrode 130, a second well region 140, a third well region 150, a gate pad 160, an emitter electrode 170 and a protected region 180 provided in the semiconductor apparatus 100.

The protective diode 120 is formed to electrically connect the runner electrode 130 and the third well region 150. The protective diode 120 will be described later.

The runner electrode 130 is configured to be connected to the gate terminal 112 of the semiconductor element 110 and has an equal voltage to the gate voltage of the semiconductor element 110. The runner electrode 130 is insulated from the emitter electrode 170 and surrounds the emitter electrode 170. Surrounding the emitter electrode 170 in this way, the runner electrode 130 reduces the noise that may have a voltage value approximately equal to or lower than the gate voltage and may be input into the emitter electrode 170 enclosed within the runner electrode 130.

The second well region 140 is insulated from the runner electrode 130 and surrounds the runner electrode 130. Surrounding the runner electrode 130 in this way, the second well region 140 reduces the noise that may have a voltage value approximately equal to or lower than the breakdown voltage of the p-n junction formed by the second well region 140 and may be input into the runner electrode 130 and the emitter electrode 170 enclosed within the second well region 140. In other words, the second well region 140 serves as a guard ring designed to protect the runner electrode 130 and the emitter electrode 170 against a voltage signal input from outside or the like. The second well region 140 may be omitted if, for example, the runner electrode 130 can be expected to provide sufficient protection against the voltage signal input from outside.

The third well region 150 is insulated from the second well region 140 and surrounds the second well region 140. The third well region 150 is provided at the periphery of the semiconductor apparatus 100 and isolates the elements from outside. The third well region 150 is connected to the protective diode 120.

The gate pad 160 is an electrode pad connected to the runner electrode 130. The gate pad 160 is, for example, the gate terminal 112. When the semiconductor apparatus 100 is housed within a package or the like, the gate pad 160 is electrically connected by means of the wire bonding technique or the like with the terminal provided in the package. The gate pad 160 and the runner electrode 130 may be integrally formed or the gate pad 160 may be part of the runner electrode 130.

The emitter electrode 170 serves as an electrode unit for the semiconductor element 110, which is formed in the lower portion of the emitter electrode 170. In other words, the semiconductor element 110 is formed in at least a portion of the emitter electrode 170 in the −Z direction in FIG. 2. A plurality of semiconductor elements 110 may be formed. The emitter terminal 114 is, for example, at least a portion of the emitter electrode 170. At least a portion of the emitter electrode 170 may be formed as an electrode pad. When the semiconductor apparatus 100 is housed within a package or the like, at least part of the emitter electrode 170 is electrically connected by means of the wire bonding technique or the like with the terminal provided in the package.

The protected region 180 is surrounded by the runner electrode 130 and/or the second well region 140 and less affected by the voltage signal input from outside. For example, when the XY plane is seen from above, the protected region 180 is surrounded by the runner electrode 130 and/or the second well region 140 and includes therein the semiconductor element 110 and the emitter electrode 170. If the second well region 140 is omitted, the protected region 180 is surrounded by the runner electrode 130. Stated differently, the runner electrode 130 and/or the second well region 140 is an edge termination region that surrounds the region including the semiconductor element 110 and the emitter electrode 170 and thus defines the protected region 180. In the present embodiment, an exemplary case will be described where the second well region 140 is provided in the semiconductor apparatus 100, the second well region 140 serves as an edge termination region and the protected region 180 is surrounded by the second well region 140.

Figure 3:
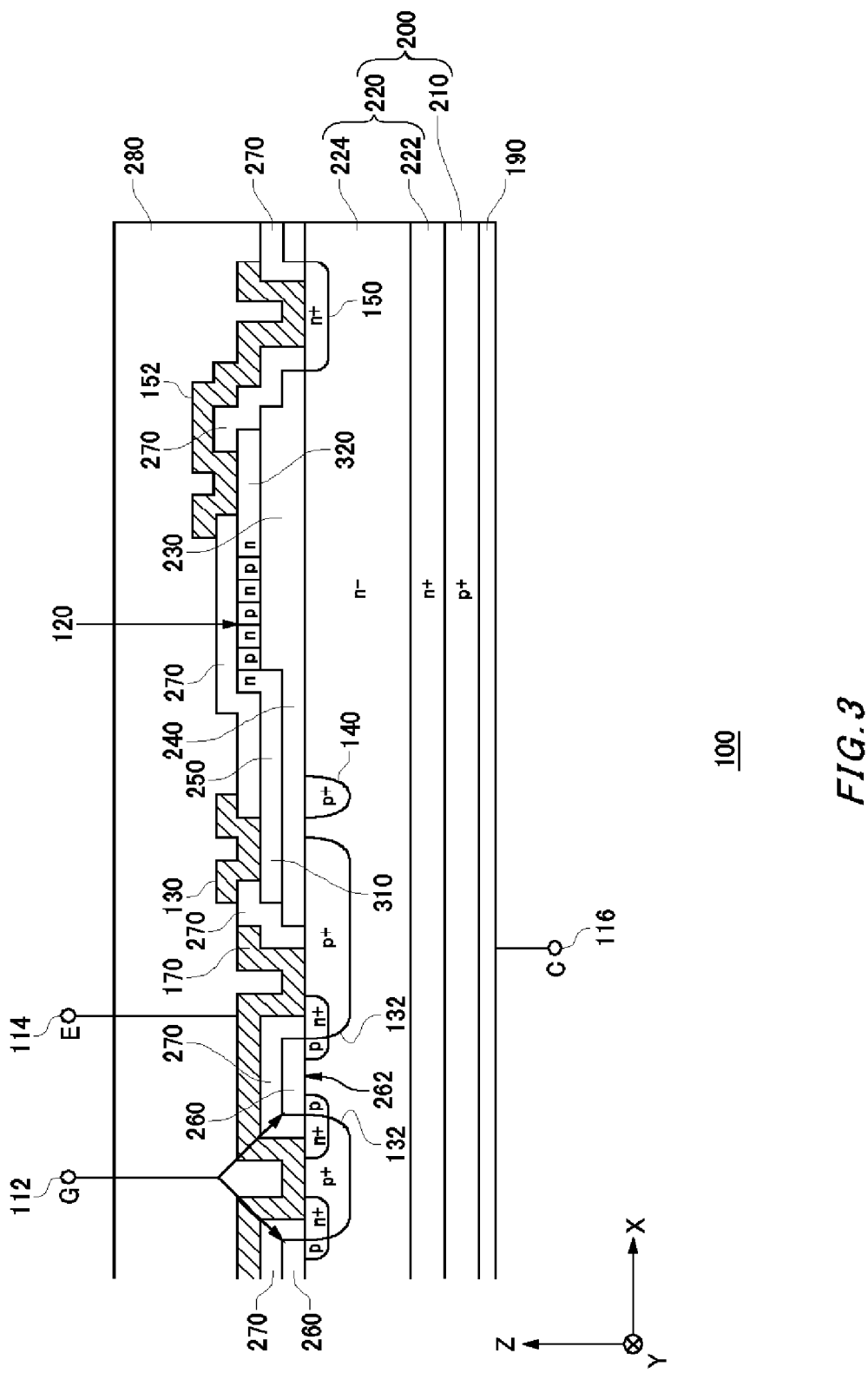
FIG. 3 shows a first example of the cross-section of the semiconductor apparatus 100 relating to the embodiment of the present invention.

FIG. 3 shows a first example of the cross-section of the semiconductor apparatus 100 of the embodiment of the present invention. The semiconductor apparatus 100 includes a semiconductor substrate 200. FIG. 3 shows an exemplary case where a first surface of the semiconductor substrate 200 denotes the surface that faces the +Z direction and the first surface is defined as being substantially parallel to the XY plane. FIG. 3 shows an exemplary structure of the cross-section of the semiconductor apparatus 100 along the XZ plane that is substantially perpendicular to the first surface of the semiconductor apparatus 100.

In the semiconductor apparatus 100, the gate terminal 112 and the emitter terminal 114 are disposed on the first surface of the semiconductor substrate 200, and the collector terminal 116 is disposed on a second surface that faces away from the first surface. Stated differently, the semiconductor element 110 is formed using the semiconductor substrate 200. FIG. 3 shows an exemplary case where the semiconductor apparatus 100 includes an IGBT (the semiconductor element 110), which establishes or cuts off the electrical connection in the vertical direction (the Z direction) between the emitter terminal 114 and the collector terminal 116 in response to the control signal input into the gate terminal 112.

In the semiconductor substrate 200, an n-type layer region 220 is provided on the first surface of a $p^+$-type layer region 210. The semiconductor substrate 200 is, for example, a silicon substrate. The semiconductor substrate 200 is formed by, for example, epitaxially growing the n-type layer region 220 on the first surface of the p-type substrate doped with boron or the like. Alternatively, the n-type layer region 220 of the semiconductor substrate 200 may be formed by implanting impurities such as phosphorous or arsenic into the first surface of the p-type substrate.

The n-type layer region 220 includes an $n^+$-type layer region 222 and an $n^-$-type layer region 224. The $n^+$-type layer region 222 is disposed on the $p^+$-type layer region 210 and serves as a buffer region, for example. The n-type layer region 224 is formed to include the first surface of the n-type layer region 220 and serves as a drift region in which carriers move, for example. In the present embodiment, the n-type conductivity, layers and regions mean that electrons are the majority carriers, and the p-type conductivity, layers and regions mean that holes are the majority carriers. The conductivity types, layers and regions exhibit higher impurity concentration when the letters "n" and "p" are accompanied with the sign "+" than when the letters "n" and "p" are not accompanied with the sign "+" and exhibit lower impurity concentration when the letters "n" and "p" are accompanied with the sign "−" than when the letters "n" and "p" are not accompanied with the sign "−."

A collector electrode 190 is formed on the $p^+$-type layer region 210 of the semiconductor substrate 200. A portion of the collector electrode 190 is, for example, a collector terminal 116. The collector electrode 190 may be electrically connected to a substrate or the like that is used to form a package. In this case, the collector electrode 190 is fixed using solder and the like.

In the $n^-$-type layer region 224 that includes the first surface of the n-type layer region 220, a first well region 132, the second well region 140 and the third well region 150 are formed. In the first well region 132, the emitter region of the semiconductor element 110 is formed. A plurality of first well regions 132 are formed in the n-type layer region 220. For example, the first well region 132 is an electrically conductive $p^+$-type region, in which an $n^+$-type region is formed as the emitter region. The first well region 132, along with the emitter region, is connected to the emitter terminal 114. Adjacent to the first well region 132, for example, a p-type region having a lower impurity concentration than the first well region 132 may be formed.

The second well region 140 is positioned closer to the edge of the semiconductor substrate 200 than the first well region 132 is and electrically insulated from the first well region 132. The second well region 140 is, for example, an electrically conductive $p^+$-type region. The second well region 140 and the surrounding n-type layer region 220 forms a p-n junction, which forms a depletion layer. This prevents carriers, which result from a high voltage and the like applied to the semiconductor substrate 200, from flowing toward the first well region 132. The third well region 150 is formed along the periphery of the semiconductor substrate 200 and electrically connected to the collector terminal 116.

On the $n^-$-type layer region 224 including the first surface of the n-type layer region 220, the runner electrode 130, the electrode unit 152, the emitter electrode 170, a first insulative film 230, a second insulative film 240, a semiconductor film 250, a gate electrode 260, a third insulative film 270 and a fourth insulative film 280 are stacked. The runner electrode 130 is connected to the gate terminal 112 and the gate electrode 260. The gate electrode 260 is formed between two first well regions 132 that are adjacent to each other in the X direction. The gate electrode 260 is connected to the gate terminal 112. It should be noted that a gate insulator 262 is formed between the gate electrode 260 and the n-type layer region 220. The emitter electrode 170 is in contact with the first well region 132. The emitter electrode 170 is placed above the gate electrode 260.

The first insulative film 230 and the second insulative film 240 are formed on the first surface of the n-type layer region 220. The first insulative film 230 and the second insulative film 240 include, for example, an oxide film. The first insulative film 230 and the second insulative film 240 are made of silicon oxide, for example. The second insulative film 240 is in contact with the first insulative film 230 and thinner than the first insulative film 230.

The semiconductor film 250 is formed on the upper surface of the first insulative film 230 and the second insulative film 240, and connected to the runner electrode 130 at one end thereof and to the third well region 150 at the other end thereof. The semiconductor film 250 is made of, for example, polysilicon. A portion of the semiconductor film 250 that is positioned on the first insulative film 230 is used to form the protective diode 120.

In other words, the protective diode 120 is made of polysilicon. The protective diode 120 has a first terminal 310 and a second terminal 320. The first terminal 310 is positioned within the protected region 180, which is enclosed by the edge termination region (the second well region 140). The first terminal 310 is, for example, electrically connected to the runner electrode 130. The second terminal 320 is positioned outside the protected region 180, which is enclosed by the edge termination region. The second terminal 320 is, for example, electrically connected to the third well region 150 via the electrode unit 152. In this manner, the protective diode 120 is formed between the gate terminal 112 and the collector terminal 116.

The protective diode 120 extends between the first terminal 310 and the second terminal 320 (in other words, in the X direction). The protective diode 120 includes a plurality of first-conductivity-type semiconductor layers and a plurality of second-conductivity-type semiconductor layers that are adjacent to and alternate with each other. For the protective diode 120, the first-conductivity-type semiconductor layers and the second-conductivity-type semiconductor layers are formed by, for example, injecting p- and n-type materials alternately in the X direction into the semiconductor film 250.

The third insulative film 270 electrically insulates different electrodes from each other. The third insulative film 270 may have a contact hole therein, which is filled with an electrode material. For example, the third insulative film 270 has a contact hole therein, which is positioned on the surface of the first well region 132 to allow the emitter electrode 170 to be in contact with the first well region 132. The third insulative film 270 has another contact hole therein, which is positioned on the surface of the first terminal 310 of the protective diode 120 to allow the runner electrode 130 to be in contact with the protective diode 120.

The third insulative film 270 also has contact holes therein, which are respectively positioned on the surface of the third well region 150 and the surface of the second terminal 320 of the protective diode 120 to allow the electrode unit 152 to be in contact respectively with the third well region 150 and the protective diode 120. The fourth insulative film 280 is formed as a surface protective film of the semiconductor apparatus 100.

In the semiconductor apparatus 100 relating to the above-described present embodiment, when a high voltage of approximately 400 V is applied to the collector terminal 116, for example, the protective diode 120 operates to clamp the voltage between the emitter terminal 114 and the collector terminal 116 as described with reference to FIG. 1. When a high voltage exceeding 400 V is input into the collector, however, electric fields concentrate in at least part of the surrounding region of the protective diode 120. The electric field concentration occurring in the surrounding region of the protective diode 120 will be described in the following.

Figure 4:
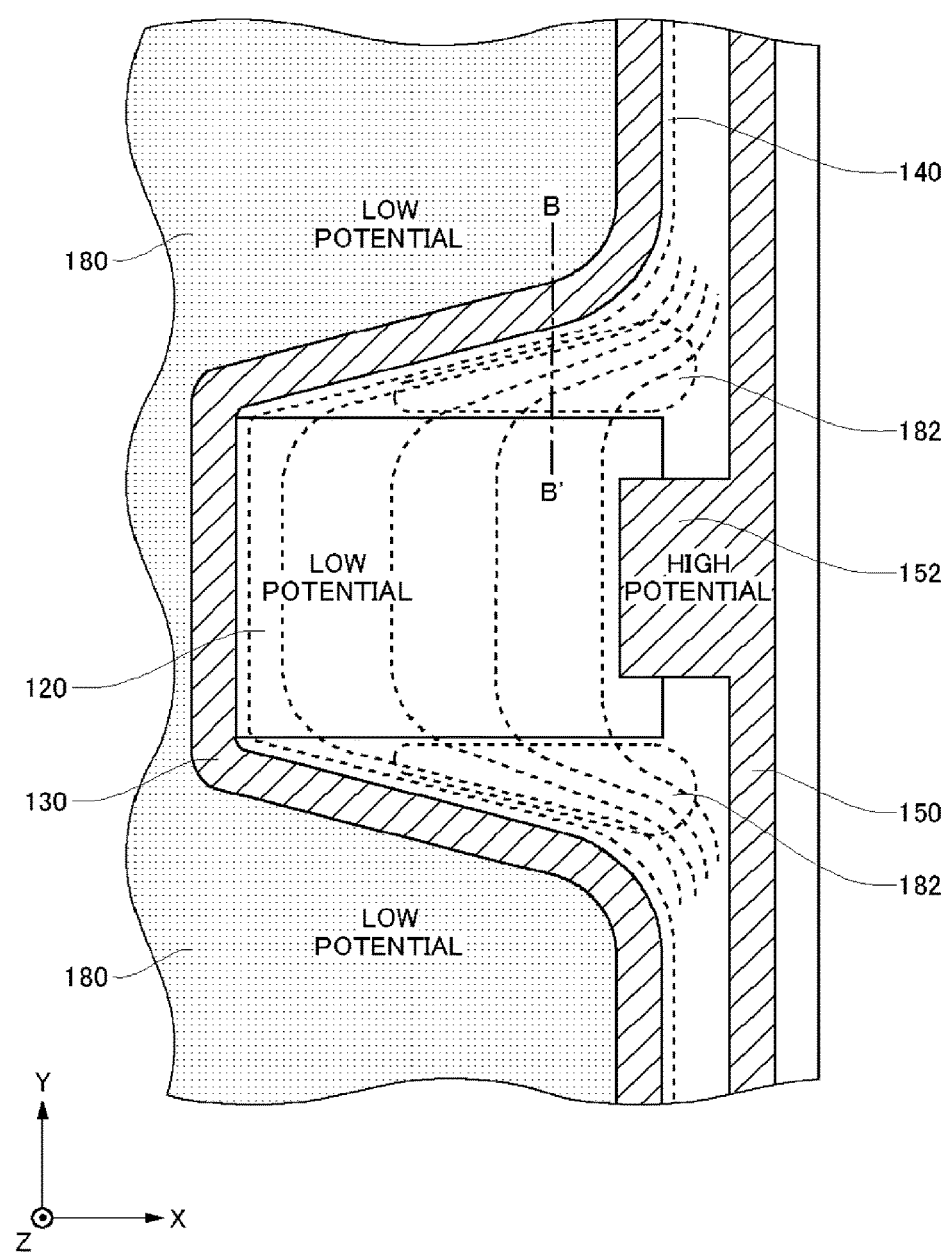
FIG. 4 is an enlarged view showing an exemplary structure of a region S of a semiconductor apparatus 100, which is shown in FIG. 2.

FIG. 4 is an enlarged view showing an exemplary structure of a region S of the semiconductor apparatus 100, which is shown in FIG. 2. FIG. 4 shows an exemplary potential distribution that may be observed when a high voltage of approximately 400 V is applied to the collector terminal 116. Being electrically connected to the collector terminal 116 and thus having substantially the same potential as the collector terminal 116, the third well region 150, the electrode unit 152 and the second terminal 320 exhibit a high potential in accordance with the high voltage input into the collector terminal 116. On the other hand, the edge termination region and the protected region 180, which is enclosed within the edge termination region, have a low potential.

In FIG. 4, the dotted lines represent equipotential lines, each of which go through the points of substantially the same potential. The intervals between the equipotential lines show a relatively determined nature of the potential gradient. Specifically speaking, the potential gradient is larger and electric fields thus concentrate when the intervals are narrow than when the intervals are wide. For example, in the direction in which the protective diode 120 extends (the X direction), the equipotential line intervals are relatively wide as seen from FIG. 4. This indicates that the potential gradient is gradual when compared with the other portions. In a gap portion 182, the equipotential line intervals are narrow and the electric fields thus concentrate when compared with the direction in which the protective diode 120 extends. The gap portion 182 is positioned between the protective diode 120 and the region of the edge termination region that is aligned with the protective diode 120. The following will further describe the potential distribution in the gap portion 182.

Figure 5:
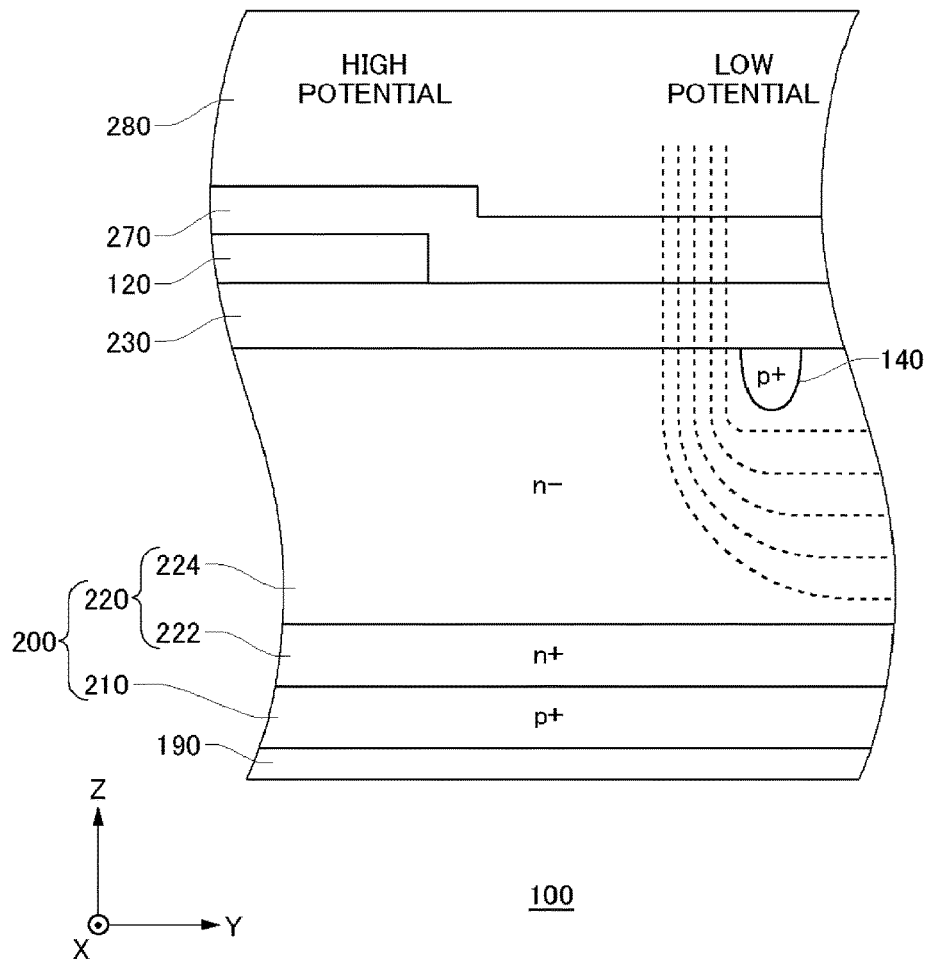
FIG. 5 shows a second example of the cross-section of the semiconductor apparatus 100 of the embodiment of the present invention.

FIG. 5 shows a second example of the cross-section of the semiconductor apparatus 100 of the embodiment of the present invention. FIG. 5 is a cross-sectional view showing, as an example, the cross-section of the semiconductor apparatus 100 cut along the line B-B' shown in FIG. 4. FIG. 5 shows a cross-section of the semiconductor apparatus 100 along the plane substantially parallel to the YZ plane. In FIG. 5, the dotted lines indicate the equipotential lines, each of which go through the points of substantially the same potential, as in FIG. 4. The equipotential lines are densely arranged in the vicinity of the second well region 140, which serves as the edge termination region. Specifically speaking, the depletion layer formed by the p-n junction between the second well region 140, which exhibits a low potential, and its surrounding region extends to reach the edge of the semiconductor apparatus 100 and the high-potential region of the protective diode 120. The high potential abruptly drops to the low potential in the vicinity of the second well region 140 from the potential of the high-potential region of the protective diode 120.

As described above, in the semiconductor apparatus 100, electric field concentration takes place between the side surface of the protective diode 120 that extends perpendicularly to the extending direction of the protective diode 120 (the side surface in the Y direction) and the edge termination region that opposes the side surface. Accordingly, when a voltage exceeding, for example, 400 V is input into the collector terminal 116 of the semiconductor apparatus 100, the electric fields further concentrate in the region between the side surface of the protective diode 120 and the corresponding edge termination region. This may cause the semiconductor apparatus 100 to break down.

To deal with this issue, a semiconductor apparatus 300 relating to an embodiment of the present invention includes a diffusion layer having a floating potential between the side surface of the protective diode 120 and the corresponding edge termination region. The diffusion layer is configured to diffuse the electric fields in the region from the side surface of the protective diode 120 to the opposing edge termination region, in order to prevent the semiconductor apparatus 300 from breaking down. Such a semiconductor apparatus 300 will be described in the following. As with the semiconductor apparatus 100 described with reference to FIGS. 1 to 3, the semiconductor apparatus 300 relating to the embodiment of the present invention includes the gate terminal 112, the emitter terminal 114 and the collector terminal 116, and establishes or cuts off the electrical connection between the emitter terminal 114 and the collector terminal 116 in response to the switching control signal input into the gate terminal 112. In other words, the way to ignite the ignition device 1000 using the semiconductor apparatus 300 is substantially the same as the way to ignite ignition device 1000 using the semiconductor apparatus 100 and thus not described here.

The semiconductor apparatus 300 relating to the present embodiment may be structured in substantially the same manner as the portion of the semiconductor apparatus 100 relating to the embodiment excluding the region S shown in FIG. 2. Stated differently, the portion of the semiconductor apparatus 300 excluding the region S operates in substantially the same manner as the semiconductor apparatus 100, which is described with reference to FIGS. 1 to 3. Therefore, substantially the same constituents are assigned with the same reference numerals and not illustrated or described here.

Figure 6:
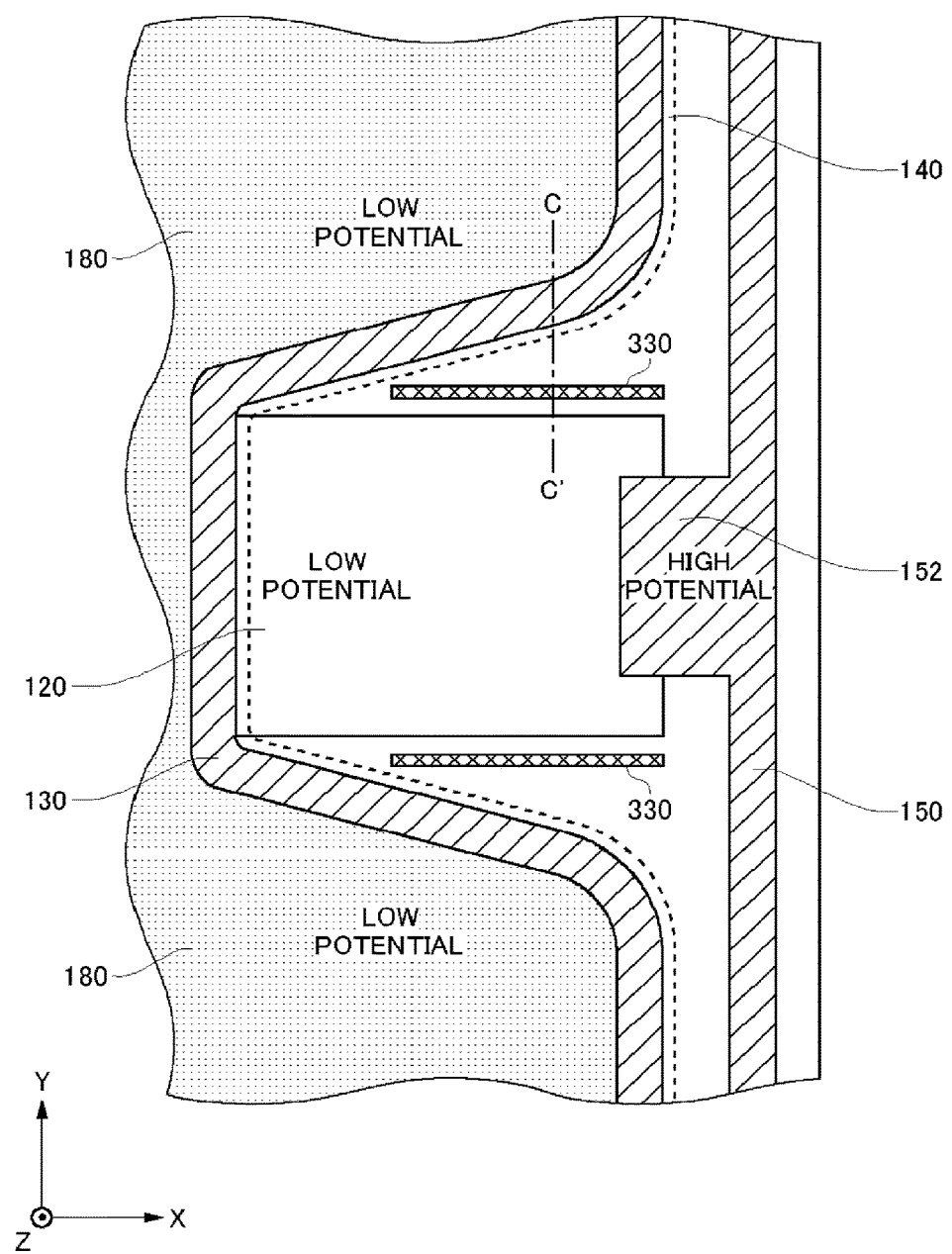
FIG. 6 is an enlarged view showing an exemplary structure of a region S of a semiconductor apparatus 300 relating to an embodiment of the present invention.

FIG. 6 is an enlarged view showing an exemplary structure of the region S of the semiconductor apparatus 300 relating to the embodiment of the present invention. The semiconductor apparatus 300 includes a diffusion layer 330. The diffusion layer 330 is disposed in the gap portion 182. The diffusion layer 330 has a floating potential and is of the conductivity type opposite to the conductivity type of the first surface of the semiconductor substrate 200, for example. Here, the gap portion 182 denotes the region between the region of the edge termination region that is aligned with the protective diode 120 and the protective diode 120 as shown in FIG. 6. The gap portion 182 is adjacent to and extends along the protective diode 120 in the direction in which the protective diode 120 extends between the first terminal 310 and the second terminal 320, for example.

The diffusion layer 330 is, for example, formed only in the gap portion 182 between the region of the edge termination region that is aligned with the protective diode 120 and the protective diode 120. Alternatively, the diffusion layer 330 may be provided only in a portion of the outer surrounding region of the edge termination region, where the portion includes the gap portion 182. As another alternative, the diffusion layer 330 may be formed in a portion of or across the annularly-shaped region extending from the gap portion 182 along the periphery of the edge termination region. The diffusion layer 330 extends in substantially the same direction as the protective diode 120, which extends between the first terminal 310 and the second terminal 320 (i.e., in the X direction), for example.

The diffusion layer 330 is, for example, an electrically conductive p$^+$-type region. Preferably, the diffusion layer 330 is formed in the semiconductor substrate 200 together with at least one of the first well region 132, the second well region 140 and the third well region 150. More preferably, the diffusion layer 330 is formed together with the first well region 132, the second well region 140, and the third well region 150. In this case, the diffusion layer 330, the first well region 132, the second well region 140 and the third well region 150 are formed by, for example, injecting substantially the same impurities into the semiconductor substrate 200.

The diffusion layer 330 is formed so as not to be electrically connected to an electrically conductive material having a fixed potential. In other words, the diffusion layer 330 is formed to have a floating potential independent from the reference potential and the power source. The diffusion layer 330 described above diffuses the concentrated electric fields in the vicinity of the protective diode 120. The potential distribution observed for the semiconductor apparatus 300 having the diffusion layer 330 formed therein will be described in the following with reference to FIG. 7.

Figure 7:
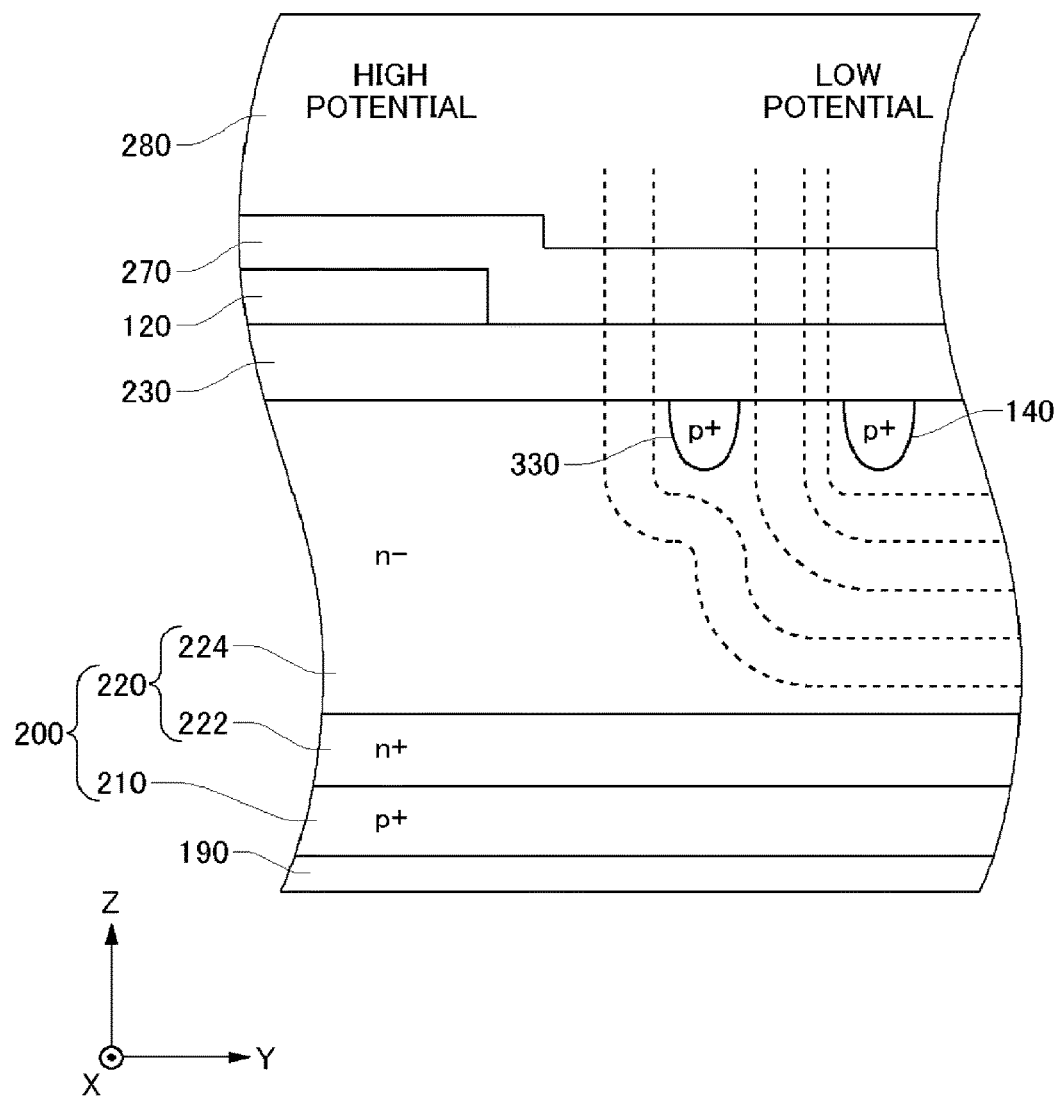
FIG. 7 shows an exemplary cross-section of the semiconductor apparatus 300 relating to the embodiment of the present invention.

FIG. 7 shows an exemplary cross-section of the semiconductor apparatus 300 relating to the embodiment of the present invention. FIG. 7 is a cross-sectional view showing, as an example, the cross-section of the semiconductor apparatus 300 cut along the line C-C' shown in FIG. 6. FIG. 7 shows the cross-section of the semiconductor apparatus 300 along the plane substantially parallel to the YZ plane. In FIG. 7, the dotted lines indicate the equipotential lines, each of which go through the points of substantially the same potential. The intervals between the equipotential lines are expanded, when compared with the potential distribution for the semiconductor apparatus 100 shown in FIG. 5, by means of the diffusion layer 330 provided between the side surface of the protective diode 120 in the Y direction and the edge termination region. This means that the electric field concentration is relaxed. Since the diffusion layer 330 of the floating potential also forms an electric field gradient therein, the potential distribution can be diffused in the region in which the diffusion layer 330 is formed. This can prevent the electric field concentration.

The semiconductor apparatus 300 further includes the fourth insulative film 280 that is in contact with and covers the diffusion layer 330. The fourth insulative film 280 is preferably a resistive insulative film. The fourth insulative film 280 is made of, for example, silicon nitride (SiN). The fourth insulative film 280 preferably has a refractive index of 2.9 to 3.3. The fourth insulative film 280 may be provided as a surface protective film for the semiconductor apparatus 300. In this case, the fourth insulative film 280 covers the semiconductor element 110, the edge termination region, the protective diode 120 and the diffusion layer 330 on the first surface of the semiconductor substrate 200. Such a resistive fourth insulative film 280 limits the carrier movement and thus contributes to maintain the diffused potential distribution achieved by the diffusion layer 330 of the floating potential. Accordingly, the fourth insulative film 280 serves to prevent the electric field concentration together with the diffusion layer 330. The above-described semiconductor apparatus 300 was subject to a reliability test. The test results are shown in FIG. 8.

Figure 8:
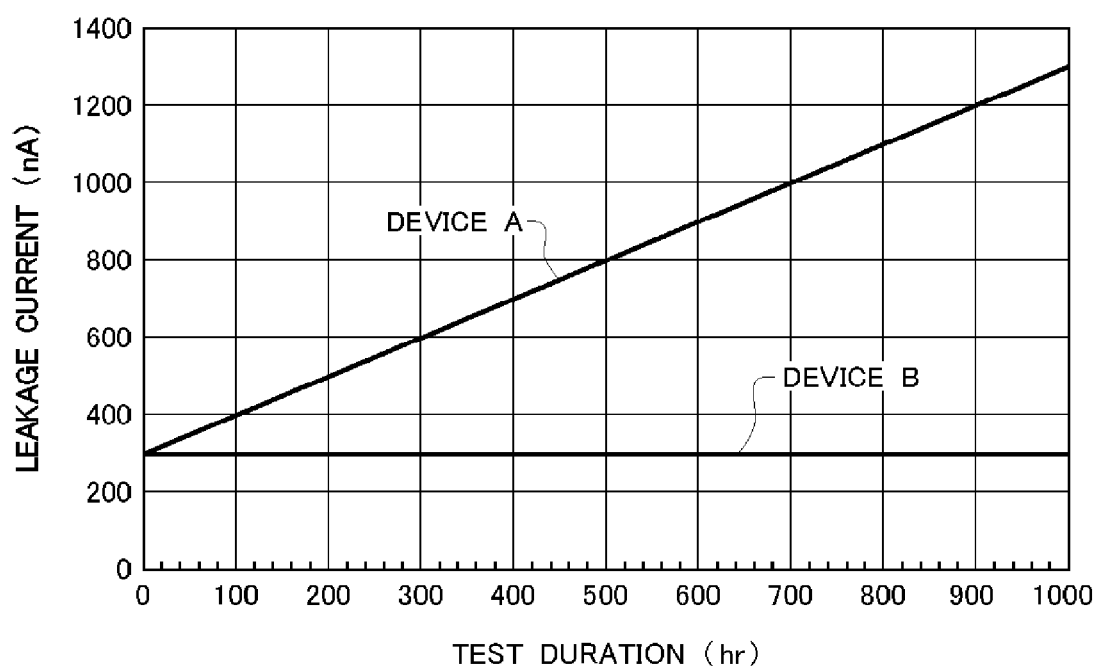
FIG. 8 shows, as an example, the results of a reliability test conducted on the semiconductor apparatus 300 relating to the embodiment of the present invention.

FIG. 8 shows, as an example, the results of a reliability test performed on the semiconductor apparatus 300 relating to the embodiment of the present invention. FIG. 8 shows the variations in the leakage currents between the emitter terminal 114 and the collector terminal 116 measured after a DC voltage is applied for a given duration to the collector terminal 116 of the semiconductor apparatus 300. In FIG. 8, the horizontal axis represents the duration for which the DC voltage is kept applied to the collector terminal 116 and the vertical axis represents the leakage currents observed after the DC voltage is applied. In FIG. 8, the results of the test conducted on the semiconductor apparatus 100 are labeled as "DEVICE A" and the results of the test conducted on the semiconductor apparatus 300 are labeled as "DEVICE B." The test results labeled as DEVICE A reveal that the leakage currents increase as the DC voltage application duration increases. This indicates that such a DC voltage compromises the reliability.

On the other hand, the results labeled as DEVICE B indicate that the leakage currents hardly vary even if the DC voltage is continuously applied. In other words, the semiconductor apparatus 300 relating to the present embodiment can achieve improved reliability based on the relaxation of the electric field concentration, which is attributable to the diffusion layer 330 formed in the gap portion 182. The above description for the semiconductor apparatus 300 has been made in relation to the case where a high voltage of a given level (DC component) is input into the collector terminal 116. In addition, it can be expected that the semiconductor apparatus 300 can produce the similar effects in a case where a high voltage is suddenly input into the collector terminal 116, for example, an abnormal surge. Consequently, while using the protective diode 120 to protect the protected region 180 against the high voltage input into the collector terminal 116, the semiconductor apparatus 300 can prevent electric field concentration from taking place in the vicinity of the protective diode 120. In this manner, the semiconductor apparatus 300 can achieve improved reliability.

Figure 9:
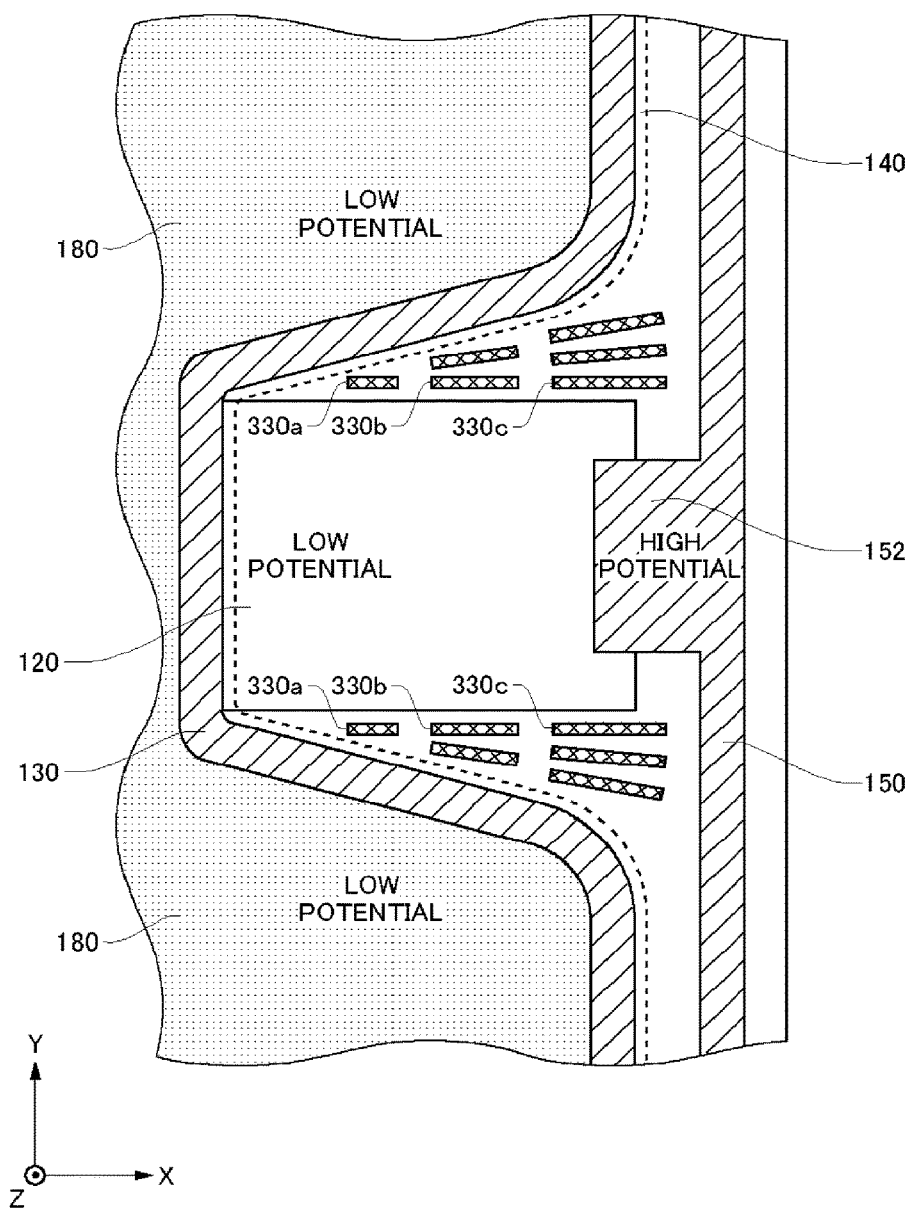
FIG. 9 shows a modification example of the semiconductor apparatus 300 relating to the embodiment of the present invention.

The above description for the semiconductor apparatus 300 relating to the present embodiment has been made with reference to an exemplary case where a single diffusion layer 330 extends in a single gap portion 182 in the direction in which the protective diode 120 extends. Alternatively, a plurality of diffusion layers 330 may be formed in a single gap portion 182. FIG. 9 shows a modification example of the semiconductor apparatus 300 relating to the present embodiment. FIG. 9 is an enlarged view showing an exemplary structure of the region S of the semiconductor apparatus 300 relating to the present modification example.

In the semiconductor apparatus 300 relating to the present modification example, a plurality of diffusion layers 330 are disposed at a plurality of different sites in the direction in which the gap portion 182 extends. FIG. 9 shows an exemplary case where six diffusion layers 330 are formed in one gap portion 182. Alternatively or additionally, a plurality of diffusion layers 330 may be arranged in the gap portion 182 at a plurality of different sites between the protective diode 120 and the edge termination region. FIG. 9 shows an exemplary case where a plurality of diffusion layers 330b and a plurality of diffusion layers 330c are arranged at a plurality of different sites between the side surface of the protective diode 120 and the runner electrode 130.

Here, D1 denotes the number of diffusion layers 330 arranged at a plurality of different sites between the protective diode 120 and the edge termination region at a first position defined in terms of the direction in which the protective diode 120 extends. Likewise, D2 denotes the number of diffusion layers 330 arranged at a plurality of different sites between the protective diode 120 and the edge termination region at a second position defined in terms of the direction in which the protective diode 120 extends. Here, the second position is closer to the second terminal 320 than the first position is. Here, D1 and D2 may be the same. Alternatively, D1 may be smaller than D2.

FIG. 9 shows an exemplary case where one diffusion layer 330a is formed at a position closer to the first terminal 310 of the protective diode 120, two diffusion layers 330b are formed at a position closer to the second terminal 320 than the diffusion layer 330a is, and three diffusion layers 330c are formed at a position closer to the second terminal 320 than the diffusion layers 330b. With a plurality of diffusion layers 330 provided as described above, the semiconductor apparatus 300 can diffuse the electric field concentration more effectively. In the semiconductor apparatus 300, the diffusion layers 330 may be arranged in such a manner that the number of diffusion layers 330 at each position increases as the position moves from the low potential side to the high potential side. In this way, the electric fields are diffused more thoroughly on the high potential side. As a result, the potentials can be more uniformly distributed across the entire gap portion 182. In the semiconductor apparatus 300, diffusion layers 330 of a smaller volume may be disposed at more sites in the gap portion 182.

According to the above description of the semiconductor apparatus 300 relating to the present embodiment, one or more diffusion layers 330 of a floating potential are provided in one gap portion 182. Alternatively or additionally, one or more diffusion layers 330 having a predetermined potential may be provided in one gap portion 182 in the semiconductor apparatus 300. In this case, the electric field concentration can be prevented by predicting in advance the potential distribution in the gap portion 182 and determining in advance the potentials of the diffusion layers 330 in such a manner that the potential distribution is diffused across the gap portion 182.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor apparatus comprising:
a semiconductor substrate;
a semiconductor element that is formed in the semiconductor substrate and provides a main current;
an edge termination region that is formed in the semiconductor substrate on a first surface side thereof, the edge termination region surrounding the semiconductor element;
a protective diode that is formed on a first surface of the semiconductor substrate and has a first terminal and a second terminal, the first terminal being positioned within a region enclosed by the edge termination region and the second terminal being positioned outside the region enclosed by the edge termination region;
a diffusion layer that has a floating potential and is formed in the semiconductor substrate on the first surface side thereof, the diffusion layer being provided in a gap portion between a region of the edge termination region that is aligned with the protective diode and the protective diode, and the diffusion layer having a conductivity type that is opposite to a conductivity type of the first surface of the semiconductor substrate; and
a resistive insulative film being provided on the first surface of the semiconductor substrate and covering the semiconductor element, the edge termination region, the protective diode and the diffusion layer, wherein
the diffusion layer is provided only in a portion of the gap portion between the region of the edge termination region that is aligned with the protective diode and the protective diode, and
the diffusion layer does not overlap the protective diode when viewed in a direction perpendicular to the first surface of the semiconductor substrate.

2. The semiconductor apparatus as set forth in claim 1, wherein
a plurality of the diffusion layers are provided at a plurality of different sites in a direction in which the gap portion extends.

3. The semiconductor apparatus as set forth in claim 1, wherein
a plurality of the diffusion layers are provided in the gap portion at a plurality of different sites between the protective diode and the edge termination region.

4. The semiconductor apparatus as set forth in claim 3, wherein
the number of the diffusion layers arranged at a plurality of different sites between the protective diode and the edge termination region at a first position that is defined in terms of the direction in which the protective diode extends is smaller than the number of the diffusion layers arranged at a plurality of different sites between the protective diode and the edge termination region at a second position that is defined in terms of the direction in which the protective diode extends and closer to the second terminal than the first position is.

5. The semiconductor apparatus as set forth in claim 1 further comprising
an insulative layer that is in contact with the diffusion layer and covers the diffusion layer.

6. The semiconductor apparatus as set forth in claim 1, wherein
the protective diode includes a plurality of first-conductivity-type semiconductor layers and a plurality of second-conductivity-type semiconductor layers that alternate with and are adjacent to each other.

7. The semiconductor apparatus as set forth in claim 1, wherein
the protective diode is made of polysilicon.

8. The semiconductor apparatus as set forth in claim 1, wherein the resistive insulative film is made of SiN.

9. The semiconductor apparatus as set forth in claim 1, wherein
the semiconductor element is an IGBT or MOSFET.

10. The semiconductor apparatus as set forth in claim 1, wherein the diffusion layer further extends at least as far as the bottom end of the protective diode.

11. The semiconductor apparatus as set forth in claim 1, wherein the diffusion layer is oriented substantially in parallel to a direction in which the protective diode extends between the first terminal and the second terminal.

12. The semiconductor apparatus as set forth in claim 11, wherein the diffusion layer terminates at an end of the protective diode in which the second terminal is located.

13. A semiconductor apparatus comprising:

a semiconductor substrate;

a semiconductor element that is formed in the semiconductor substrate and provides a main current;

an edge termination region that is formed in the semiconductor substrate on a first surface side thereof, the edge termination region surrounding the semiconductor element:

a protective diode that is formed on a first surface of the semiconductor substrate and has a first terminal and a second terminal, the first terminal being positioned within a region enclosed by the edge termination region and the second terminal being positioned outside the region enclosed by the edge termination region; and a plurality of diffusion layers, each diffusion layer having a floating potential and is formed in the semiconductor substrate on the first surface side thereof, the diffusion layer being provided in a gap portion between a region of the edge termination region that is aligned with the protective diode and the protective diode, and the diffusion layer having a conductivity type that is opposite to a conductivity type of the first surface of the semiconductor substrate, wherein each diffusion layer extends along the protective diode substantially in parallel to the direction in which the protective diode extends between the first terminal and the second terminal, and wherein the diffusion layers are provided in the gap portion at a plurality of different sites between the protective diode and the edge termination region, and the number of the diffusion layers arranged at a plurality of different sites between the protective diode and the edge termination region at a first position that is defined in terms of the direction in which the protective diode extends is smaller than the number of the diffusion layers arranged at a plurality of different sites between the protective diode and the edge termination region at a second position that is defined in terms of the direction in which the protective diode extends and closer to the second terminal than the first position is.

14. The semiconductor apparatus as set forth in claim 13, wherein the diffusion layer terminates at an end of the protective diode in which the second terminal is located.

15. The semiconductor apparatus as set forth in claim 13, wherein the diffusion layer terminates at an end of the protective diode in which the second terminal is located.

* * * * *